US012418291B2

(12) United States Patent
Liu et al.

(10) Patent No.: US 12,418,291 B2
(45) Date of Patent: Sep. 16, 2025

(54) NON-CONTACT SWITCH AND CONTROL SYSTEM THEREOF

(71) Applicant: DARWIN PRECISIONS CORPORATION, Hsinchu County (TW)

(72) Inventors: chih-hung Liu, Hsinchu County (TW); Ya-Han Ko, Hsinchu County (TW); Ran-Shiou You, Hsinchu County (TW); Hsing-Yu Chen, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 177 days.

(21) Appl. No.: 18/109,872

(22) Filed: Feb. 15, 2023

(65) Prior Publication Data
US 2024/0120919 A1    Apr. 11, 2024

(30) Foreign Application Priority Data

Oct. 6, 2022 (TW) .................................. 111138013

(51) Int. Cl.
*H03K 17/94* (2006.01)
(52) U.S. Cl.
CPC .................... *H03K 17/941* (2013.01)
(58) Field of Classification Search
CPC .................................................. H03K 17/941
See application file for complete search history.

(56) References Cited

U.S. PATENT DOCUMENTS

| 5,397,890 A * | 3/1995 | Schueler | A01D 34/828 |
| | | | 250/221 |
| 2001/0012001 A1* | 8/2001 | Rekimoto | G06F 3/017 |
| | | | 345/173 |
| 2005/0057701 A1* | 3/2005 | Weiss | G02B 27/0101 |
| | | | 349/10 |
| 2009/0284747 A1 | 11/2009 | Valois | |

(Continued)

FOREIGN PATENT DOCUMENTS

| CN | 112299170 A | 2/2021 |
| CN | 112563053 A | 3/2021 |

(Continued)

*Primary Examiner* — Daniel C Puentes

(57) ABSTRACT

A non-contact switch and a non-contact switch control system are provided. The non-contact switch control system includes multiple non-contact switches, each including an infrared light module, a brightness sensing unit, a second switch module and a processing unit. The infrared light module includes a first switch module, transmitting unit and receiving unit. The first switch module has a first switch state. The transmitting unit connected to the first switch module emits infrared light according to the first switch state. The receiving unit receives a reflected light of the infrared light. The brightness sensing unit generates brightness information according to an ambient light. The second switch module has a second switch state. The processing unit is connected with the infrared light module, the brightness sensing unit and the second switch module, and controls the second switch state according to the reflected light and the brightness information.

10 Claims, 2 Drawing Sheets

(56) References Cited

U.S. PATENT DOCUMENTS

| | | | |
|---|---|---|---|
| 2011/0006188 A1* | 1/2011 | Lin ........................ | G01S 7/497 |
| | | | 341/110 |
| 2022/0135372 A1 | 5/2022 | Qiu | |
| 2022/0335745 A1 | 10/2022 | Lai et al. | |
| 2023/0255837 A1* | 8/2023 | Harpin .................. | A61F 15/005 |
| | | | 602/41 |

FOREIGN PATENT DOCUMENTS

| | | |
|---|---|---|
| TW | 201627841 A | 8/2016 |
| TW | M625605 U | 4/2022 |
| WO | 2006056814 A1 | 6/2006 |

* cited by examiner

NON-CONTACT SWITCH AND CONTROL SYSTEM THEREOF

FIELD OF THE INVENTION

The invention relates to a non-contact switch and a control system thereof, and more particularly, to a non-contact switch and its control system with the function of cleaning.

BACKGROUND OF THE INVENTION

Non-contact products can avoid the chain of germ spread caused by contact, but there is a need for cleaning the non-contact products due to the dust accumulated thereon, etc.

When cleaning an existing non-contact switches (e.g., a floating touch switch, etc.), the cleaning personnel may often unnecessarily initiate the non-contact switch due to accidentally touching during cleaning.

SUMMARY OF THE INVENTION

In view of this, the present invention provides a non-contact switch and a non-contact switch control system. The non-contact switch control system comprises a plurality of non-contact switches and a processing unit. The non-contact switch can emit infrared light through the emitting unit of the infrared light module, then receive the reflected light of the infrared light through the receiving unit, and generate brightness information according to the ambient light through the brightness sensing unit. The processing unit can control the first switch state of the first switch module according to the brightness information generated by the brightness sensing unit, control whether the emitting unit emits infrared light or not, and control the second switch state of the second switch module among a plurality of non-contact switches according to the reflected light of infrared light received by the receiving unit.

The non-contact switch provided by the invention comprises an infrared light module, a brightness sensing unit, a second switch module and a processing unit. The infrared light module comprises a first switch module, a transmitting unit and a receiving unit. The first switch module has a first switch state. The transmitting unit is connected to the first switch module, and arranged to emit infrared light according to the first switch state. The receiving unit is arranged to receive a reflected light of the infrared light. The brightness sensing unit is used for generating brightness information according to an ambient light. The second switch module has a second switch state. The processing unit is connected with the infrared light module, the brightness sensing unit and the second switch module, and is arranged to control the second switch state according to the reflected light and the brightness information.

In an embodiment of the present invention, the non-contact switch further comprises a storage unit connected to the processing unit, and arranged to store a control program. The brightness information comprises a first brightness information and a second brightness information. The control program is used to perform a difference calculation according to the first brightness information and the second brightness information, and generate a brightness difference information. The processing unit is further used to execute the control program and control the second switch state according to the brightness difference information.

In an embodiment of the present invention, regarding the non-contact switch, the processing unit further generates a pulse signal according to the brightness difference information, and the second switch module is further used to receive the pulse signal.

In an embodiment of the present invention, the non-contact switch further comprises a light source for generating the ambient light.

In an embodiment of the present invention, regarding the non-contact switch, the first switch state and the second switch state are an open circuit state and a short circuit state, respectively.

The present invention provides a non-contact switch control system that comprises a plurality of non-contact switches and a processing unit. Each of the non-contact switches comprises an infrared light module, a brightness sensing unit and a second switch module. The first switch module with a first switch state. The transmitting unit is connected to the first switch module, and arranged to emit infrared light according to the first switch state. The receiving unit is arranged to receiving a reflected light of the infrared light. The brightness sensing unit is arranged to generate brightness information according to an ambient light. The second switch module has a second switch state. The processing unit is connected to the non-contact switches, and arranged to control the second switch state of the second switch module of the non-contact switches according to the reflected light and the brightness information of each non-contact switch.

In an embodiment of the present invention, the non-contact switch control system further comprises a storage unit connected to the processing unit, and arranged to store a control program. The brightness information comprises a first brightness information and a second brightness information. The control program is used to perform a difference calculation according to the first brightness information and the second brightness information, and generate a brightness difference information. The processing unit is further used to execute the control program and control the second switch state of the second switch module of the non-contact switches according to the brightness difference information.

In an embodiment of the present invention, regarding the non-contact switch, the processing unit further generates a pulse signal according to the brightness difference information, and the non-contact switches are further used to receive the pulse signal.

In an embodiment of the present invention, the non-contact switch control system further comprises a light source for generating the ambient light.

In an embodiment of the present invention, regarding the non-contact switch, the first switch state and the second switch state are an open circuit state and a short circuit state, respectively.

To sum up, the non-contact switch and its control system of the present invention can detect ambient light through the brightness sensing unit. When the cleaning staff cleans the non-contact switch, the non-contact switch of the present invention may enter a cleaning mode, and temporarily stop the emitting unit in the infrared light module from emitting infrared light until the cleaning operation is completed. With the above-mentioned structure, the non-contact switch will not be enabled by mistouching of the cleaning staff upon cleaning. For example, the invention can be further applied to an elevator system, and the non-contact switch of the invention will not be enabled by mistake due to mistouching of the cleaning staff due to the cleaning operation. Therefore, when being applied to the elevator system, the invention can avoid unnecessary summoning the elevator, thereby saving the electricity and reducing the waiting session of users.

BRIEF DESCRIPTION OF THE DRAWINGS

In order to make the above and other objectives, features and advantages of the present invention more obvious and easier to understand, the following examples will be described in details with reference to the accompanied drawings.

DETAILED DESCRIPTION OF PREFERRED EMBODIMENTS

Figure 1:
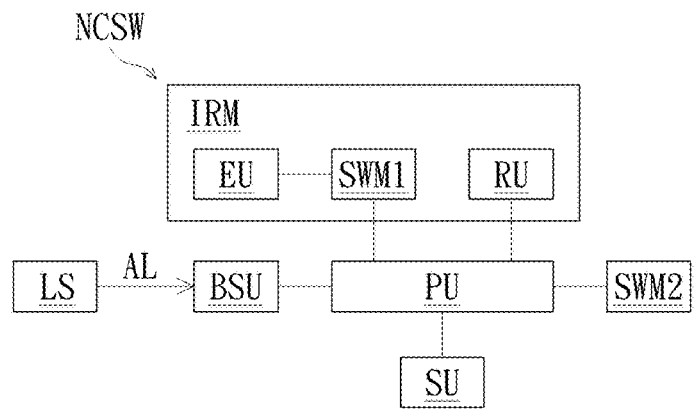
FIG. 1 is a block diagram of a non-contact switch according to an embodiment of the present invention.

Please refer to FIG. 1, which is a block diagram of a non-contact switch according to an embodiment of the present invention.

In this embodiment, the non-contact switch NCSW of the present invention comprises an infrared light module IRM, a processing unit PU, a brightness sensing unit BSU, a storage unit SU, and a second switch module SWM2. The infrared light module IRM comprises a transmitting unit EU, a first switch module SWM1, and a receiving unit RU. The first switch module SWM1 is connected with the transmitting unit, EU and the processing unit PU. The processing unit PU is connected with the brightness sensing unit BSU, the storage unit SU, the receiving unit RU, and the second switch module SWM2.

In this embodiment, the non-contact switch NCSW of the present invention can generate brightness information according to the ambient light AL through the brightness sensing unit BSU. Then, the processing unit PU can control the first switch state of the first switch module SWM1 according to the brightness information, and control the emitting unit EU according to the first switch state of the first switch module SWM1, so that the emitting unit EU emits infrared light (i.e., turning on infrared light emission) or does not emit infrared light (i.e., turning off infrared light emission). The processing unit PU can control the second switch state of the second switch module SWM2 according to the reflected light of infrared light. For example, when the emitting unit EU emits infrared light and the receiving unit RU receives the reflected light of the infrared light by the reflection of the object, the processing unit PU can control the second switch state of the second switch module SWM2, so that the second switch state may be an open-circuit state or a short-circuit state. When the receiving unit RU does not receive the reflected light of infrared light, the processing unit PU can control the second switch state of the second switch module SWM2, so that the second switch state may be a short-circuit state or an open-circuit state (i.e., in this example, the second switch state when the receiving unit RU receives the reflected light is different from the second switch state when the receiving unit RU does not receive the reflected light). In addition, in this embodiment, the second switch module SWM2 of the non-contact switch NCSW of the present invention can be further connected to other external circuits, and the external circuits can be controlled by the second switch state of the second switch module SWM2. To sum up, in the non-contact switch NCSW of the present invention, the processing unit PU can control the second switch state of the second switch module SWM2 according to the reflected infrared light emitted by the emitting unit EU and the brightness information generated by the brightness sensing unit BSU, thereby further controlling the external circuit.

In this embodiment, the non-contact switch NCSW of the present invention comprises an infrared light module IRM, wherein the infrared light module IRM comprises a first switch module SWM1, a transmitting unit EU, and a receiving unit RU.

The first switch module SWM1 refers to a device used as a switch in a circuit, to switch the emission state of the emission unit EU and control whether the emission unit EU emits infrared light or not. The first switch module SWM1 has a first switch state, which refers to the switch state of the first switch module SWM1 in the circuit. For example, the first switch state may comprise an open circuit state and a short circuit state. The processing device PU may transmit a control signal to switch the first switch state of the first switch module SWM1, thereby controlling whether the emitting unit EU emits infrared light or not. For example, the first switch module SWM1 may be a multi-stage switch (e.g., opening/short-circuiting the circuit), a transistor switch (e.g., controlling the voltage/current to make the transistor active in the cut-off region/saturation region, the first switch state can be regarded as the open state of the invention when the transistor acts in the cut-off region, and the first switch state can be regarded as the short-circuit state of the invention when the transistor acts in the saturation region), or a logic circuit. However, the present invention is not limited thereto. Any device that can control the emitting unit EU to switch between emitting and not emitting the infrared light can be used as the first switch module SWM1 of the present invention, and the present invention is not limited to the listed embodiments.

The emission unit EU refers to a device connected to the first switch module SWM1 and used to emit infrared light according to the first switch state of the first switch module SWM1. For example, the emitting unit EU may be an Infrared light-emitting diode (IR LED). The emitting unit EU can detect whether an object (or a human body, such as a finger) approaches the non-contact switch NCSW in a way beyond the capability of human eyes. When an object approaches, the infrared light of the emitting unit EU will be reflected by the object, and then the receiving unit RU will receive the reflected infrared light. The processor PU can control the second switch module SWM2 according to the reflected light of the infrared light.

In this embodiment, the non-contact switch NCSW of the present invention comprises a brightness sensing unit BSU, wherein the brightness sensing unit BSU refers to a device connected to the processing unit PU and used for generating brightness information according to ambient light AL. For example, the brightness sensing unit BSU can be a device such as a photo resistor, photo transistor, a photo diode, etc., which can directly or indirectly obtain the brightness information of the environment in which the non-contact switch NCSW is located (in one embodiment, the brightness sensing unit BSU generates brightness information for ambient visible light), but the present invention is not limited thereto. As long as a device can directly or indirectly obtain the brightness of the environment in which the non-contact switch NCSW is located, it can be used as the brightness sensing unit BSU of the present invention.

In this embodiment, the non-contact switch NCSW of the present invention comprises a second switch module SWM2, wherein the second switch module SWM2 refers to a device connected to the processing unit PU and used as a switch in a circuit. The second switch module SWM2 has a second switch state which refers to the switch state of the second switch module SWM2 in the circuit. The second switch state may comprise, for example, an open circuit state and a short circuit state. The processing device PU may, for example, transmit a control signal to switch the second switch state of the second switch module SWM2. The second switch module SWM2 can be connected to other external circuits, so that the processing unit PU can control the external circuits by the second switch state of the second switch module SWM2. For example, the second switch module SWM2 can be a multi-stage switch (e.g., a switch with stages that allows for opening/short circuiting the circuit), a transistor switch (e.g., a switch for controlling the voltage/current to make the transistor act in the cut-off region/saturation region. The first switch state can be regarded as the open state of the present invention when acting in the cut-off region, and can be regarded as the short-circuit state of the present invention when the transistor acts in the saturation region), or a logic circuit, but the present invention is not limited thereto. As long as a device can control an external circuit by change the state of switch, it can be used as the second switch module SWM2.

In this embodiment, the non-contact switch NCSW of the present invention comprises a processing unit PU functioning as the processing core of the device and connected with the infrared light module IRM, the brightness sensing unit BSU and the second switch module SWM2, and is used to control the second switch state of the second switch module SWM2 according to the reflected light of infrared light and brightness information. For example, the processing unit PU can be a single-chip microcomputer (MCU), CPU, etc. or other devices with the same functions. The above-listed types of processing units are only examples, and are not meant to limit the scope of the present invention. Any device that can control the second switch state of the second switch module SWM2 according to the reflected light of infrared light and brightness information can be used as the processing unit PU of the present invention.

In this embodiment, the non-contact switch NCSW of the present invention comprises a storage unit SU which refers to a device connected to the processing unit PU and used to store a control program. In one embodiment, the brightness information generated by the brightness sensing unit BSU may further comprise: first brightness information which refers to the brightness information generated at a first time point (i.e., an earlier time point), and second brightness information which refers to the brightness information generated at the second time point (i.e., a later time point). The processing unit PU can further execute a control program, which is used to perform difference calculation according to the first brightness information and the second brightness information, and generate brightness difference information. For example, the processing unit PU can further execute a control program, and perform a difference calculation on the value of the first brightness information generated at the first time point and the value of the second brightness information generated at the second time point to generate brightness difference information. According to the numerical value of the brightness difference information, the non-contact switch NCSW of the present invention can switch the non-contact switch NCSW to the cleaning mode when the ambient brightness changes sharply (e.g., when the brightness information generated by the brightness sensing unit BSU suddenly drops to a very low level), so that the emitting unit EU does not emit infrared light temporarily, and the non-contact switch NCSW will not be enabled due to accidental touch. For example, the storage unit SU can be a non-volatile memory, memory card, register, etc. or other devices with the same functions. The listed types of storage devices are only examples, and the present invention is not limited thereto. All storage devices with the same function can be used as the storage unit SU of the present invention. In this embodiment, the processing unit PU can be further used to execute the control program and control the second switch state of the second switch module SWM2 according to the brightness difference information. In one embodiment, the processing unit PU can generate a pulse signal according to the brightness difference information, and the second switch module SWM2 can receive the pulse signal to control the second switch module SWM2 using the pulse signal.

In one embodiment, the non-contact switch NCSW of the present invention may further comprise a light source LS for generating ambient light AL. In one embodiment, the light source LS is an external light source provided by the environment, for example, it can be a light source LS set up in the environment where the non-contact switch NCSW is located. In one embodiment, the light source LS is an internal light source set up in the non-contact switch NCSW, which is connected to the processing unit PU (not shown) to provide stable ambient light when the ambient brightness of the non-contact switch NCSW is too low or unstable.

Figure 2:
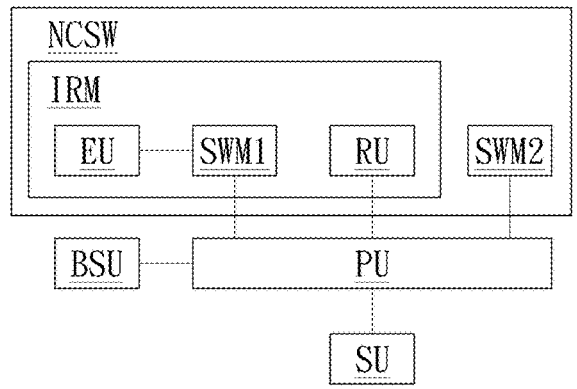
FIG. 2 is a block diagram of a non-contact switch control system according to an embodiment of the present invention.

Next, please refer to FIG. 2, which is a block diagram of a non-contact switch control system according to an embodiment of the present invention.

The invention provides various embodiments. Amongst these embodiments of the present invention, if an element/device in current embodiment is marked by a symbol the same as those in other embodiments, the element/device may provide the same functions of those in said other embodiments. In this sense, the details will not be repeated in said current embodiment of the present invention, and only the features different from said other embodiments will be explained. The matters mentioned in various embodiments can be arbitrarily rearranged, combined, and applied to various embodiments as long as there is no conflict. The present invention, however, is not limited to the listed embodiments.

In this embodiment, the non-contact switch control system comprises a non-contact switch NCSW, a processing unit PU, a brightness sensing unit BSU, and a storage unit SU. The non-contact switch NCSW comprises an infrared light module IRM and a second switch module SWM2. The infrared light module IRM comprises a transmitting unit EU, a first switch module SWM1, and a receiving unit RU. The first switch module SWM1 is connected with the transmitting unit EU and the processing unit PU, and the processing unit PU is connected with the brightness sensing unit BSU, the receiving unit RU, the storage unit SU and the second switch module SWM2.

In this embodiment, the non-contact switch NCSW may further comprise a second switch module SWM2, and the processing unit PU can be connected with a plurality of non-contact switches NCSW by the connection manner shown in FIG. 2. This embodiment provides a connection manner of the present invention, and in this embodiment, the non-contact switch control system is presented as an example by connecting a single non-contact switch NCSW.

Figure 3:
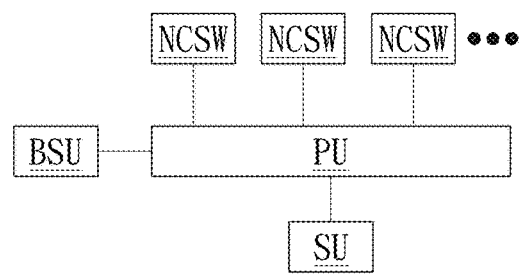
FIG. 3 is a block diagram of a non-contact switch control system according to another embodiment of the present invention.

Next, please refer to FIG. 3, which is a block diagram of a non-contact switch control system according to another embodiment of the present invention.

In this embodiment, the non-contact switch control system comprises a plurality of non-contact switches NCSW, a processing unit PU, a brightness sensing unit BSU, and a storage unit SU. Rach non-contact switch comprises an infrared light module IRM and a second switch module SWM2. The infrared light module IRM comprises a transmitting unit EU, a first switch module SWM1, and a receiving unit RU. The processing unit PU is connected with a plurality of non-contact switches NCSW, a brightness sensing unit BSU, and a storage unit SU. This embodiment provides another connection manner of the present invention, and the non-contact switch control system in this embodiment is exemplarily presented as connecting with a plurality of non-contact switches NCSW.

Figure 4:
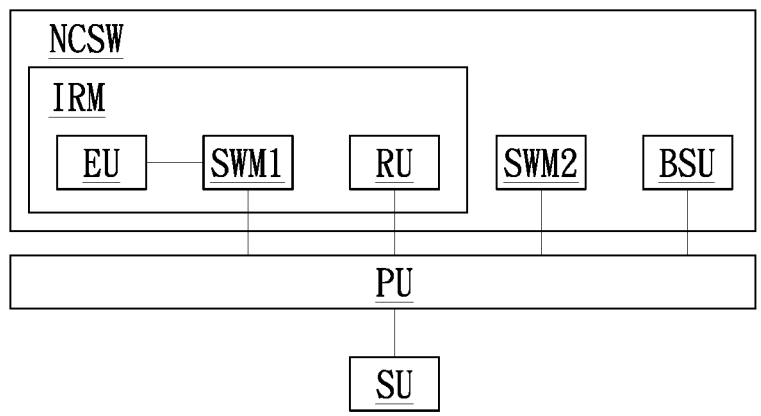
FIG. 4 is a block diagram of a non-contact switch control system according to yet another embodiment of the present invention.

Please refer to FIG. 4, which is a block diagram of a non-contact switch control system according to another embodiment of the present invention.

In this embodiment, the non-contact switch NCSW may further comprise a brightness sensing unit BSU, and the processing unit PU can be connected with a plurality of non-contact switches NCSW by the connection manner shown in FIG. 4. This embodiment provides another connection manner of the present invention, and the non-contact switch control system in this embodiment is exemplarily presented as connecting with a single non-contact switch NCSW.

Figure 5:
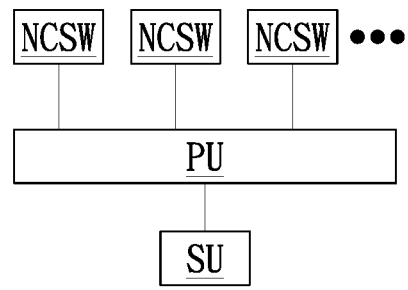
FIG. 5 is a block diagram of a non-contact switch control system according to still another embodiment of the present invention.

Please refer to FIG. 5, which is a block diagram of a non-contact switch control system according to another embodiment of the present invention.

In this embodiment, the non-contact switch control system comprises a plurality of non-contact switches NCSW, a processing unit PU, and a storage unit SU. Each non-contact switch comprises an infrared light module IRM, a brightness sensing unit BSU, and a second switch module SWM2. The infrared light module IRM comprises a transmitting unit EU, a first switch module SWM1, and a receiving unit RU. The processing unit PU is connected with a plurality of non-contact switches NCSW, a brightness sensing unit BSU, and a storage unit SU. This embodiment provides another connection manner of the present invention, and the non-contact switch control system in this embodiment is exemplarily presented as connecting with a plurality of non-contact switches NCSW.

To sum up, the non-contact switch and its control system of the present invention can detect the ambient light through the brightness sensing unit. When the cleaning staff cleans the non-contact switch, the present invention can enter the cleaning mode, and temporarily stop the emitting unit in the infrared light module from emitting infrared light until the cleaning operation is completed. With the above-mentioned structure, the non-contact switch of the present invention will not be enabled by mistouching of the cleaning staff during the cleaning operation. For example, the invention can be further applied to an elevator system, and the non-contact switch of the invention will not be enabled by mistake due to mistouching of the cleaning staff due to the cleaning operation. Therefore, when being applied to the elevator system, the invention can avoid unnecessary summoning the elevator, thereby saving the electricity and reducing the waiting session of users.

Although the present invention has been disclosed by examples, it is not intended to limit the scope of the invention. Those skilled in the art are readily to make changes and embellishments without departing from the spirit and scope of the present invention. Therefore, the scope of the present invention should base on what is defined in the appended claims.

What is claimed is:

1. A non-contact switch comprising:
   an infrared light module comprising:
      a first switch module with a first switch state;
      a transmitting unit connected to the first switch module, and arranged to emit infrared light according to the first switch state; and
      a receiving unit for receiving a reflected light of the infrared light;
   a brightness sensing unit for generating brightness information according to an ambient light;
   a second switch module with a second switch state; and
   a processing unit connected with the infrared light module, the brightness sensing unit and the second switch module, and arranged to control the second switch state according to the reflected light and the brightness information,
   wherein whether the transmitting unit emits infrared light is controlled by controlling the first switch module based on a difference information generated according to the change in the ambient light.

2. The non-contact switch according to claim 1, wherein the processing unit further generates a pulse signal according to the brightness difference information, and the second switch module is further used to receive the pulse signal.

3. The non-contact switch according to claim 1, further comprising a light source for generating the ambient light.

4. The non-contact switch according to claim 1, wherein the first switch state and the second switch state are an open circuit state and a short circuit state, respectively.

5. A non-contact switch comprising:
   an infrared light module comprising:
      a first switch module with a first switch state;
      a transmitting unit connected to the first switch module, and arranged to emit infrared light according to the first switch state; and
      a receiving unit for receiving a reflected light of the infrared light;
   a brightness sensing unit for generating brightness information according to an ambient light;
   a second switch module with a second switch state;
   a processing unit connected with the infrared light module, the brightness sensing unit and the second switch module, and arranged to control the second switch state according to the reflected light and the brightness information; and
   a storage unit connected to the processing unit, and arranged to store a control program;
   wherein the brightness information comprises a first brightness information and a second brightness information;
   wherein the control program is used to perform a difference calculation according to the first brightness information and the second brightness information, and generate a brightness difference information;
   wherein the processing unit is further used to execute the control program and control the second switch state according to the brightness difference information, wherein whether the transmitting unit emits infrared light is controlled by controlling the first switch module based on the brightness difference information.

6. A non-contact switch control system comprising:
a plurality of non-contact switches, each comprising:
an infrared light module comprising:
a first switch module with a first switch state;
a transmitting unit connected to the first switch module, and arranged to emit infrared light according to the first switch state; and
a receiving unit for receiving a reflected light of the infrared light;
a brightness sensing unit arranged to generate brightness information according to an ambient light; and
a second switch module with a second switch state; and
a processing unit connected to the non-contact switches, and arranged to control the second switch state of at least one second switch module of the non-contact switches according to the reflected light and the brightness information of each non-contact switch,
wherein whether the transmitting unit emits infrared light is controlled by controlling the first switch module based on a difference information generated according to the change in the ambient light.

7. The non-contact switch control system according to claim 6, further comprising:
a storage unit connected to the processing unit, and arranged to store a control program;
wherein the brightness information comprises a first brightness information and a second brightness information;
wherein the control program is used to perform a difference calculation according to the first brightness information and the second brightness information, and generate a brightness difference information;
wherein the processing unit is further used to execute the control program and control the second switch state of the second switch module of the non-contact switches according to the brightness difference information.

8. The non-contact switch control system according to claim 6, wherein the processing unit further generates a pulse signal according to the brightness difference information, and the non-contact switches are further used to receive the pulse signal.

9. The non-contact switch control system according to claim 6, further comprising a light source for generating the ambient light.

10. The non-contact switch control system according to claim 6, wherein the first switch state and the second switch state are an open circuit state and a short circuit state, respectively.

* * * * *